United States Patent [19]

Bonn

[11] Patent Number: 4,604,790
[45] Date of Patent: Aug. 12, 1986

[54] METHOD OF FABRICATING INTEGRATED CIRCUIT STRUCTURE HAVING CMOS AND BIPOLAR DEVICES

[75] Inventor: Matthew A. Bonn, Saratoga, Calif.

[73] Assignee: Advanced Micro Devices, Inc., Sunnyvale, Calif.

[21] Appl. No.: 718,393

[22] Filed: Apr. 1, 1985

[51] Int. Cl.$^4$ .................... H01L 21/22; H01L 21/265
[52] U.S. Cl. .................... 29/576 B; 29/571; 29/577 C; 148/1.5; 148/187; 148/DIG. 82; 357/42; 357/43; 357/91
[58] Field of Search ............. 29/576 B, 571, 577 C; 148/1.5, 187; 357/42, 43, 91

[56] References Cited

U.S. PATENT DOCUMENTS

| | | | |
|---|---|---|---|
| 4,346,512 | 8/1982 | Liang et al. | 29/571 |
| 4,362,574 | 12/1982 | Gevondyan | 148/1.5 |
| 4,411,058 | 10/1983 | Chen | 29/571 |
| 4,468,852 | 9/1984 | Cerofolini | 29/577 C |
| 4,484,388 | 11/1984 | Iwasaki | 29/571 |
| 4,509,991 | 4/1985 | Taur | 148/1.5 |
| 4,535,532 | 8/1985 | Lancaster | 29/576 B |

OTHER PUBLICATIONS

Combs IEEE-IEDM (1981) p. 346.

*Primary Examiner*—Upendra Roy
*Attorney, Agent, or Firm*—Patrick T. King; John P. Taylor; J. Vincent Tortolano

[57] ABSTRACT

An improved method is disclosed for isolating active devices in an integrated circuit structure containing both CMOS and bipolar devices to simultaneously form isolation regions to separate CMOS channels from adjacent channels or bipolar devices as well as to separate adjacent bipolar devices from one another. The improved method of isolation also results in the simultaneous formation of a retrograde p-well for the n-channel device. The improved method comprises implanting, into a substrate having field oxide portions previously grown thereon, impurities capable of forming one or more isolation regions, between the active devices, at an energy level sufficiently high to permit penetration of the impurities through the field oxide.

9 Claims, 4 Drawing Figures

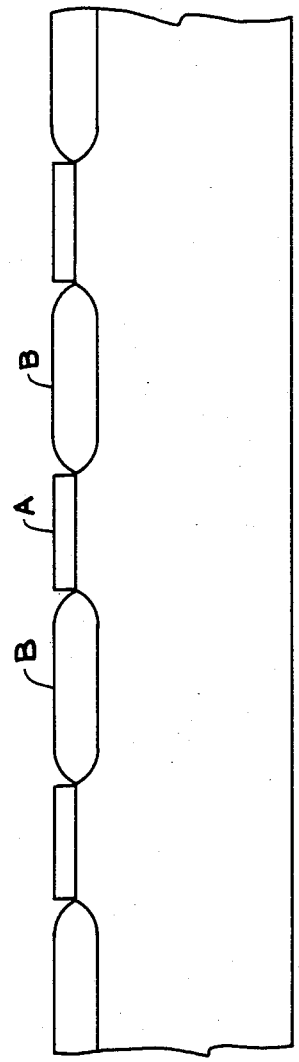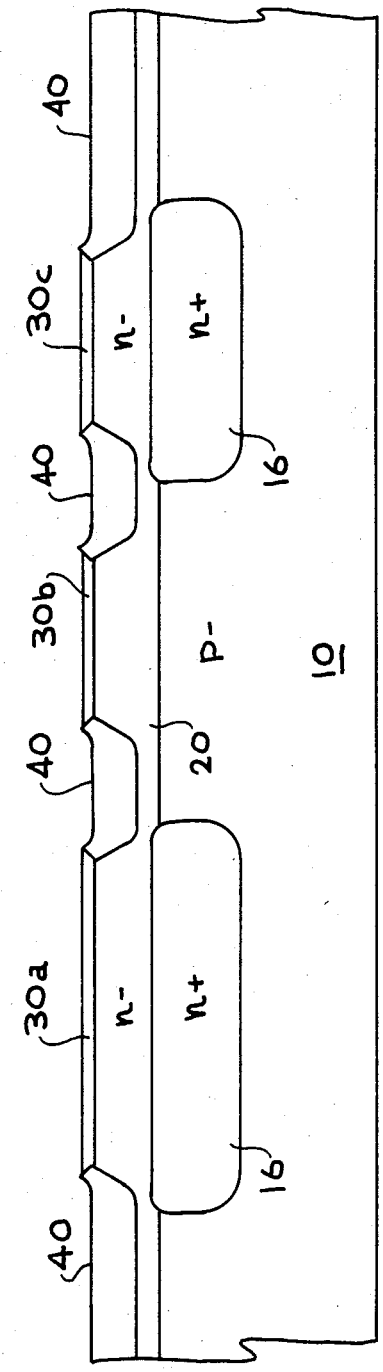

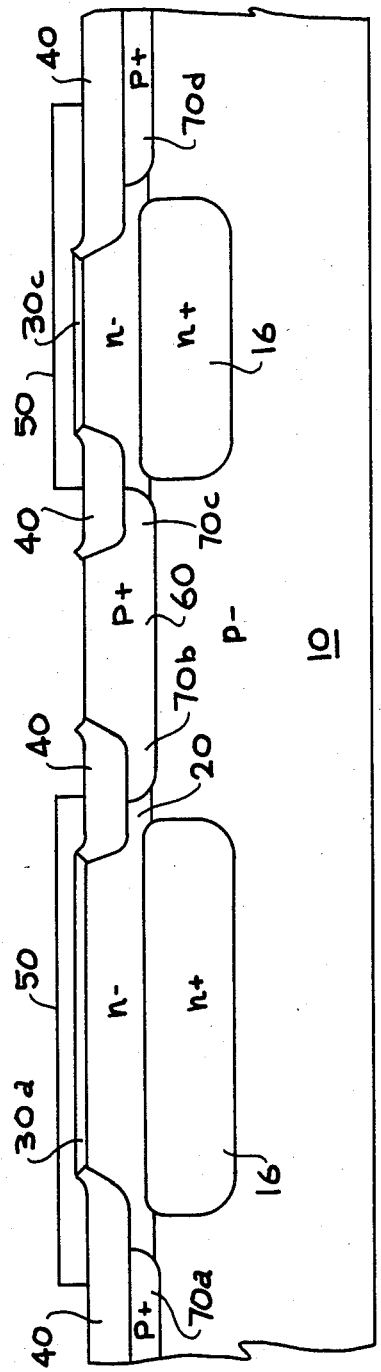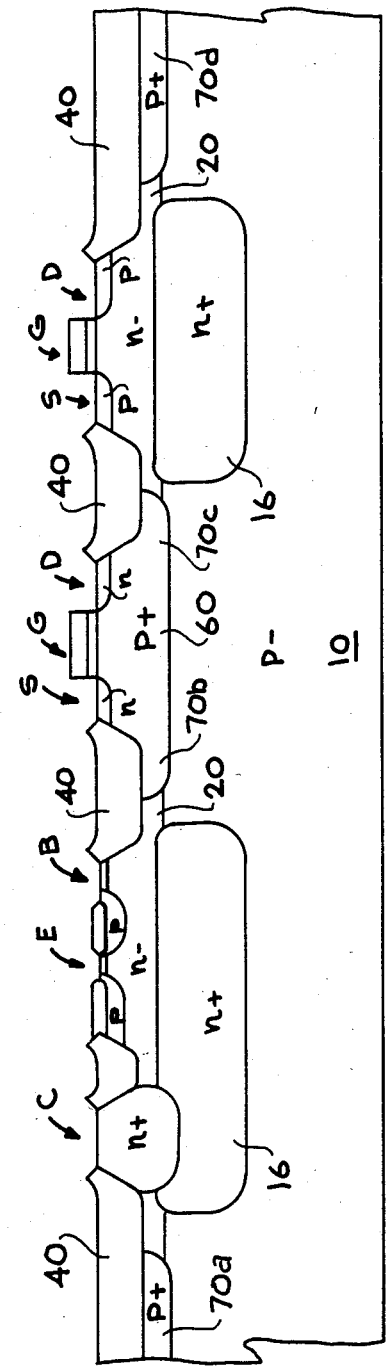

METHOD OF FABRICATING INTEGRATED CIRCUIT STRUCTURE HAVING CMOS AND BIPOLAR DEVICES

BACKGROUND OF THE INVENTION

1. Field of the Invention

This invention relates to an improvement in the method of producing integrated circuit structures containing both CMOS and bipolar devices. More particularly, this invention relates to an improved method for isolating adjacent CMOS and bipolar devices in an integrated circuit structure.

2. Description of the Prior Art

In the production of CMOS devices, it is conventional to isolate the p-channel from the adjoining n-channel using a channel stop implant. Self aligned techniques for this channel stop require introducing the dopants prior to field oxidation. However, the heat required to subsequently grow the field oxide over the doped channel stop results in diffusion of the dopant into other areas of the device including the channel. As a result of this diffusion, the usual implant dosage is generally required to be 2–3 times the amount remaining in the channel stop after the growth of the field oxide to insure that an adequate impurity concentration remains in the channel stop area after the diffusion.

Isolation of bipolar devices from adjoining devices is also necessary. This is conventionally accomplished using implantation or pre-deposition followed by diffusion of impurities and thermal oxidation to form an isolation region between the devices.

As shown in FIG. 1, previous formation of an isolation region adjacent a bipolar device by implantation of impurities required use of the additional mask shown at A during growth of the field oxide B between adjacent devices to form an opening in the field oxide for doping the substrate after removal of the mask.

If an integrated circuit structure contains both CMOS and bipolar devices, formation of the isolation regions by prior art methods can involve implantation or diffusion of the channel stops in the CMOS device prior to oxide growth, and then subsequent mask removal and implantation or diffusion of the substrate in the bipolar area after growth of the field oxide.

In an article entitled "Scaleable Retrograde P-Well CMOS Technology", published in IEDM 81 of the IEEE at pages 346–349, Stephen R. Combs describes a retrograde p-well CMOS technology utilizing a single high energy boron implant to produce both the p-well and the channel stops after growth of the field oxide. The retrograde implant penetrates the field oxide resulting in a high charge density localized directly below the field oxide. Since the field oxide is already grown and the structure is usually not exposed to further major heating, diffusion of the p-well and channel stop impurities is reduced or eliminated by this technique. This results in a retrograde well profile as well as an abrupt channel stop profile. This results in high packing density and good latch-up protection.

It would, however, be desirable to provide for the formation, in a single step, of p-wells, and isolation regions between active devices in an integrated circuit structure containing both CMOS and bipolar devices.

SUMMARY OF THE INVENTION

It is therefore an object of this invention to provide a simplified method for isolating adjoining CMOS and bipolar devices in an integrated circuit structure as well as producing a retrograde well simultaneous to the formation of the isolation regions.

It is another object of this invention to provide an improved method for isolating adjoining CMOS and bipolar devices in an integrated circuit structure by forming isolation regions between active device regions after growth of field oxide.

It is yet another object of this invention to provide an improved method for isolating adjoining CMOS and bipolar devices in an integrated circuit structure using high energy implantation of impurities to form isolation regions between active device regions after growth of field oxide.

It is a further object of this invention to provide an improved method for isolating adjoining CMOS and bipolar devices in an integrated circuit structure after growth of field oxide by implantation of impurities at an energy level sufficiently high to penetrate through the field oxide to form isolation regions between active device regions.

These and other objects of the invention will be apparent from the following description and accompanying drawings.

In accordance with the invention, an improved method for isolating active devices in an integrated circuit structure containing both CMOS and bipolar devices comprises simultaneously forming retrograde p-wells for n-MOS devices, p+ channel stops to separate CMOS devices from opposite polarity and adjacent CMOS devices, or bipolar devices, as well as forming isolation regions to separate adjacent bipolar devices from one another which comprises implanting, into a substrate having field oxide portions previously grown thereon, impurities capable of forming at least one isolation region at an energy level sufficiently high to permit penetration of the impurities through the field oxide.

BRIEF DESCRIPTION OF THE DRAWINGS

FIG. 1 is a fragmentary cross-sectional view of a prior art method of forming an isolation region adjacent a bipolar device.

FIG. 2 is a fragmentary cross-sectional view of a segment of an integrated circuit structure containing both CMOS and bipolar devices illustrating the structure prior to formation of the isolation and retrograde well regions by the method of the invention.

FIG. 3 is a fragmentary cross-sectional view of a segment of an integrated circuit structure containing both CMOS and bipolar devices illustrating the structure masked to receive the high energy implantation used to form the isolation and retrograde well regions in a further step in the method of the invention.

FIG. 4 is a fragmentary cross-sectional view of a segment of an integrated circuit structure containing both CMOS and bipolar devices illustrating the structure after formation of the isolation and retrograde well regions by the method of the invention.

DESCRIPTION OF THE PREFERRED EMBODIMENT

The improved method of the invention permits the simultaneous formation of a retrograde well in a CMOS device, of channel stops between adjacent n and p-channel devices in a CMOS device, and of isolation between adjacent bipolar devices, or between adjoining CMOS and bipolar devices in a single step using a single mask.

As previously discussed, prior art formation of an isolation region adjacent a bipolar device by implantation or diffusion of impurities, to separate it from other active device regions, required use of the additional mask feature (and a subsequent oversize mask) shown at A in FIG. 1 during growth of the field oxide B between adjacent devices to form an opening in the field oxide for subsequent doping of the substrate, after removal of the masking material, to form the isolation region or well.

In contrast, in accordance with the invention, mask A may be eliminated and the isolation region adjacent to a bipolar device may be formed simultaneous with the formation of channel stops and retrograde wells for the CMOS device in a single doping step.

Referring now to FIG. 2, a p-silicon substrate 10 has n+ buried layers 16 previously formed therein and an n-region 20 formed in the upper portion of substrate 10. A nitride mask comprising portions 30a, 30b, and 30c, in FIG. 2 has been applied to the surface of substrate 10 and a field oxide 40 has been grown on substrate 10 through the nitride mask.

After growth of field oxide 40, the isolation regions may be implanted into the structure in accordance with the invention. If desired, all of the nitride mask, or at least segment 30b, may be removed at this step as illustrated in FIG. 3. A photoresist mask 50 of sufficient thickness to withstand the implantation energy, e.g., about 2 microns or more, is then applied to the structure. After masking, Boron is implanted as B++ at an energy of 190 KEV (equivalent to B+ at 380 KEV) to penetrate substrate 10 in all unmasked areas, including unmasked areas beneath field oxide 40, to form the p-well 60, as well as isolation or channel stop regions 70a, 70b, 70c, and 70d.

After formation of p-well 60 and the isolation regions or channel stops 70a–70d, photoresist mask 50 is removed and the remainder portions of the bipolar and CMOS devices are constructed using conventional techniques to form the integrated circuit structure illustrated in FIG. 4 comprising a bipolar device adjacent to the n-channel of a CMOS device with channel stop 70b isolating the n channel device from the bipolar device and channel stop 70c separating the n-channel from the p channel device of the CMOS device. Isolation region 70a and channel stop 70d, in turn, isolate the illustrated devices from adjoining devices (not shown).

Thus the process of the invention provides a unitary method for simultaneously producing a retrograde p-well and isolation regions or channel stops in adjacent CMOS and bipolar devices with a single masking step followed by a single implantation step. Furthermore, with respect to the bipolar device, an additional mask removal step, after the field oxide growth, is eliminated due to the ability of the high energy implantation to penetrate the field oxide thus making the masking and unmasking of the area above the isolation region adjacent the bipolar device unnecessary.

Having thus described the invention, what is claimed is:

1. An improved method for isolating active devices in an integrated circuit structure containing both CMOS and bipolar devices to simultaneously form channel stops to separate CMOS channels from adjacent CMOS channels and isolation regions to separate bipolar devices from adjoining CMOS devices as well as to separate adjacent bipolar devices from one another comprises: implanting, into a substrate having field oxide portions previously grown thereon, impurities capable of forming one or more channel stops and isolation regions at an energy level sufficiently high to permit penetration of the impurities through unmasked portions of said field oxide.

2. The method of claim 1 wherein said structure is implanted with Boron at an energy level equivalent to B+ at 380 KEV.

3. The method of claim 2 wherein said boron is implanted as B++ at an accelerating potential of at least 190 kV.

4. The method of claim 3 wherein said structure is masked prior to said implantation with a material capable of with standing said high energy implantation.

5. The method of claim 4 wherein said structure is masked with a photoresist layer at least 2 microns thick.

6. The method of claim 5 wherein said mask is provided with openings adjacent said active devices to permit implantation of Boron to form said isolation regions.

7. The method of claim 6 wherein said mask is further provided with an opening above the n-channel in said CMOS device to permit simultaneous formation of the p-well for subsequent formation of said n-channel therein.

8. The method of claim 6 wherein said mask extends over only a portion of said field oxide whereby isolation regions or channel stops may be formed beneath unmasked portions of said field oxide by said high energy implantation penetrating through said unmasked portions of said field oxide.

9. An improved method for isolating active devices in an integrated circuit structure containing both CMOS and bipolar devices to simultaneously form one or more channel stops to separate CMOS channels from adjacent CMOS channels and one or more isolation regions to separate said CMOS devices from bipolar devices as well as to separate adjacent bipolar devices from one another comprising the steps of:
  (a) growing a field oxide between adjacent bipolar and CMOS devices and between the channels of said CMOS devices;
  (b) masking that portion of the structure in which the bipolar devices and the p-channel of the CMOS devices will be constructed including a portion of the field oxide adjacent thereto;
  (c) implanting, at an energy level sufficiently high to permit penetration through the unmasked portion of the field oxide, into the unmasked portions of said substrate, impurities capable of forming one or more channel stops and one or more isolation regions and at least one p-well in said substrate.

* * * * *